United States Patent
Jennison

(10) Patent No.: US 6,535,602 B1
(45) Date of Patent: Mar. 18, 2003

(54) TELECOMMUNICATIONS WIRING DEVICE

(75) Inventor: Michael T. Jennison, Cranberry Township, PA (US)

(73) Assignee: Jennison Greyfox Systems, Inc., Carnegie, PA (US)

( * ) Notice: Subject to any disclaimer, the term of this patent is extended or adjusted under 35 U.S.C. 154(b) by 0 days.

(21) Appl. No.: 09/574,515

(22) Filed: May 19, 2000

(51) Int. Cl.$^7$ .................. H01R 24/04; H01R 29/00; H01R 31/00; H04Q 1/06; H04Q 1/14

(52) U.S. Cl. .................. 379/326; 361/826; 361/828; 379/332; 379/397; 439/189; 439/296; 439/540.1; 439/701

(58) Field of Search .................. 361/826, 827, 361/828, 829; 379/325, 326, 327, 328, 329, 330, 331, 332, 397, 413.02, 413.03, 413.04; 439/49, 189, 296, 540.1, 626, 701

(56) References Cited

U.S. PATENT DOCUMENTS

| | | | | |
|---|---|---|---|---|
| 3,838,317 A | * | 9/1974 | Coyne | 174/254 |
| 3,904,936 A | * | 9/1975 | Hamrick et al. | 174/60 |
| 4,035,587 A | * | 7/1977 | Undhjem et al. | 379/325 |
| 4,160,880 A | * | 7/1979 | Brey | 361/827 |
| 4,401,353 A | * | 8/1983 | McDevitt et al. | 439/189 |
| 4,761,811 A | * | 8/1988 | Zetena, Jr. | 174/103 |
| 4,829,564 A | * | 5/1989 | Jarvis | 379/327 |
| 4,860,343 A | * | 8/1989 | Zetena, Jr. | 174/34 |

FOREIGN PATENT DOCUMENTS

DE  298 09 539 U  *  2/1999

OTHER PUBLICATIONS

Cover page from The Siemon Company catalog with pp. 9.17, 9.18 and 9.19 No Date.

* cited by examiner

*Primary Examiner*—Harry S. Hong
(74) *Attorney, Agent, or Firm*—Webb Ziesenhiem Logsdon Orkin & Hanson P.C.

(57) ABSTRACT

The present invention relates to relates to electrical connectors, and in particular to a connector that replaces industry standard "punch down block" wiring devices to eliminate the need for rewiring when changing or re-routing multiple phone lines at a given location. The present invention provides for the connection of edge card connectors to punch down blocks or other wire terminating devices that are permanently connected to incoming and outgoing phone lines in a unique way by the use of jumpers that eliminate the need for rewiring when changing or re-routing multiple phone lines at a given location. A key advantage is that the invention makes the re-routing operation foolproof in that access to the permanently connected wiring is no longer necessary thereby eliminating the possibility of negatively affecting the integrity of the phone network by attempting to customize the wiring connections.

17 Claims, 20 Drawing Sheets

TELECOMMUNICATIONS WIRING DEVICE

FIELD OF THE INVENTION

The present invention relates to electrical connectors, and in particular to a connector that replaces industry standard "punch down block" wiring devices to eliminate the need for rewiring when changing or re-routing multiple phone lines at a given location.

BACKGROUND OF THE INVENTION

Distribution of telephone or data lines to a number of telephone extensions or telecommunications devices is typically achieved by making customized connections usually using what is known as a "punch down block" or other wire terminating device. In order to change what telephone line (telephone number) is available at a given location in a home or office, the connections at the terminating device would have to be changed usually requiring a skilled technician with special tools. The result is typically a confusing maze of custom wired telephone receptacles. The only other alternatives are a complex patch panel implementation, or an expensive business type PBX or KSU telephone system.

The present invention solves this problem by connecting edge card connectors to punch down blocks or other wire terminating devices that are permanently connected to incoming and outgoing phone lines in a unique way by the use of jumpers that eliminate the need for rewiring when changing or re-routing multiple phone lines at a given location. A key advantage is that the invention makes the re-routing operation foolproof in that access to the permanently connected wiring is no longer necessary thereby eliminating the possibility of negatively affecting the integrity of the phone network by attempting to customize the wiring connections.

SUMMARY OF THE INVENTION

The present invention provides for the connection of variously configured edge card connectors with punch down blocks or other wire terminating devices that are permanently connected to incoming and outgoing phone lines by the use of jumpers that eliminate the need for rewiring when changing or re-routing multiple phone lines at a given location. The incoming wiring pairs for any number of telephone or data lines are connected to a circuit board using a punch down type connector or any other wire-terminating device. These wires are routed on the circuit board to the contacts on one side of any number of edge card connectors. The contacts on the opposite side of the edge card connectors are routed on the circuit board to a wire terminating device or punch down block connected to the individual telephone jack. Wires from the various locations where telecommunications devices are located in a home or office are connected to these termination blocks. All incoming and outgoing connections to these termination blocks are made identically following a color coded standard such as the TI 570A or 570B Standards.

Routing of incoming telephone or data lines to a given location is accomplished by plugging a jumper containing a unique wiring configuration into the edge card connector. These jumpers connect the contacts on one side of the edge card connector to the contacts on the opposite side of that connector such that the unique wiring pattern on the jumper accomplishes connection of the desired incoming telephone line (and thus telephone number) with the location assigned to that telephone number. The jumper wiring pattern can be designed to route any combination of incoming telephone or data lines to any location in the home or office. Any given incoming telephone or data line can be re-routed to a different location within that home or office by simply unplugging the jumper providing the connection to the previously used location and replacing it with a differently configured jumper having the correct wiring pattern to provide the connection to the new location.

Another unique feature of the invention allows direct connection from an outside data source such as an Ethernet Hub or Switch directly to any given telephone outlet in the home or office. This is accomplished by using a data jumper card having contacts on one side of the edge card connectors (the ones that are routed to the telephone outlets in the home or office) that are connected to a RJ-45 telephone jack on the data jumper card. The contacts on the opposite side of the edge card connector remain unconnected. Using a jumper cable from this jack to a data device, such as an Ethernet Hub, facilitates networking of computers or other telecommunications devices through telephone outlets throughout the home or office.

Another significant feature that the invention provides is convenient isolation of the internal telecommunication network from the service provider network. When no jumper cards are plugged into the edge card connectors, there is a physical break between the internal network and the service provider network. By utilizing a circuit board (isolating test card) that connects the contacts on one side of the edge card connector to standard telephone test jacks, the systems can be easily and conveniently checked. Plugging this test isolation tool into the edge card connector so that it is connected to the contacts that are routed to the service provider allows testing for dial tone, correct line assignment, and tip and ring wiring correctness. A standard, readily available telephone test tool can be connected to this isolation test card or this test isolation tool could be produced to incorporate the testing function directly on the card. In the same manner, wiring integrity from the edge card connector to the telephone jack in the home or office could also be tested for continuity, for correct line connection and for crossed wires.

Other details, objects, and advantages of the present invention will become apparent in the following description of the presently preferred embodiments.

BRIEF DESCRIPTION OF THE DETAILED DRAWINGS

FIGS. 1A and 1B are perspective and front plan views, respectively, of the telecommunications wiring device of the present invention.

FIG. 2, which is comprised of FIGS. 2a, 2b, 2c, 2d, 2e, 2f, 2g, 2h, 2i, 2j, 2k and 2l, collectively illustrate a schematic diagram of the telecommunications wiring device of the present invention.

FIGS. 4A–5A, 4B–5B, 4C–5C and 4D–5D are perspective, top plan, front plan and side plan views, respectively, of alternate preferred embodiments of the telecommunications wiring device jumper of the present invention as configured for installation of a data jack and test isolation jack, respectively.

Figure 7A:
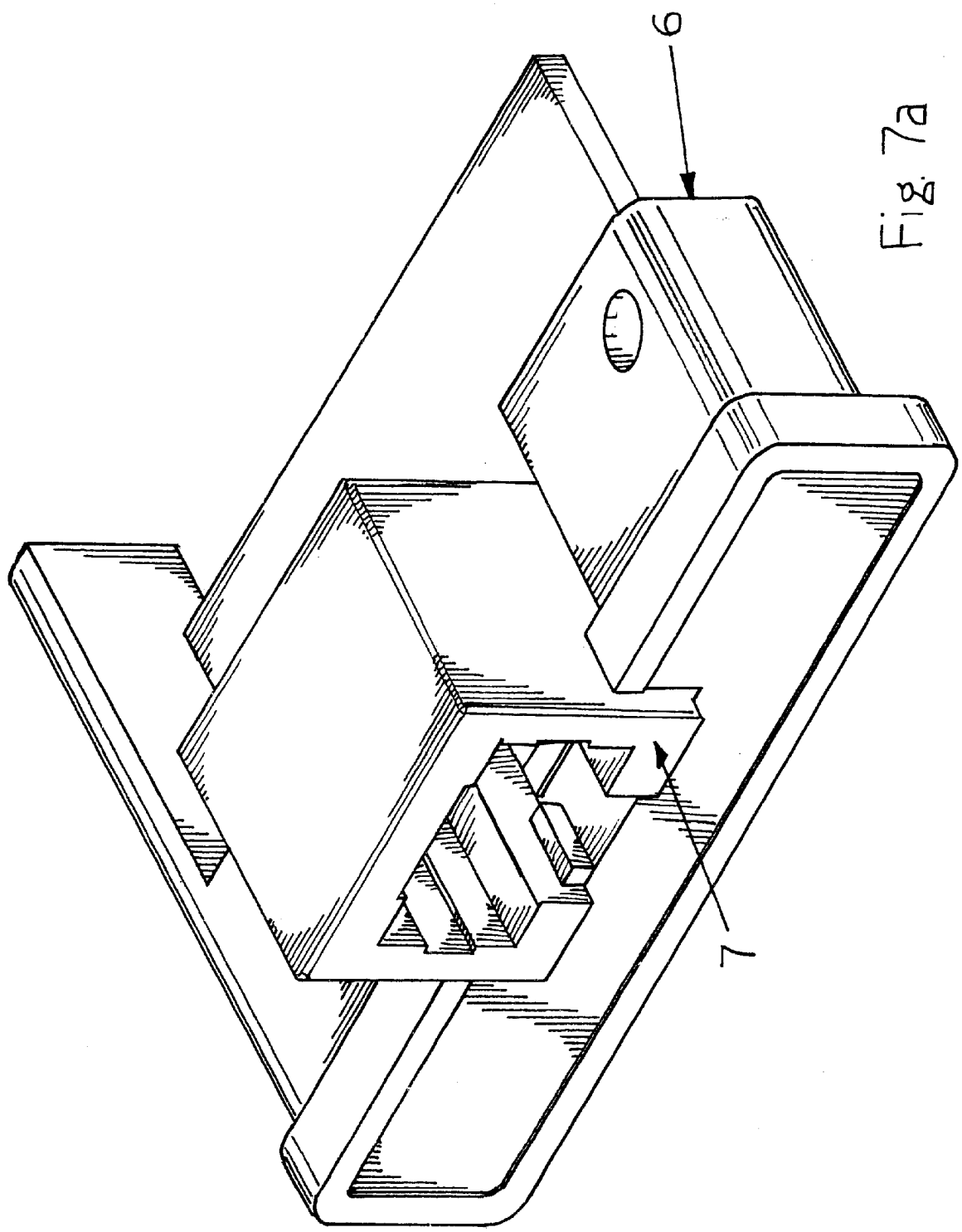
Figure 7B:
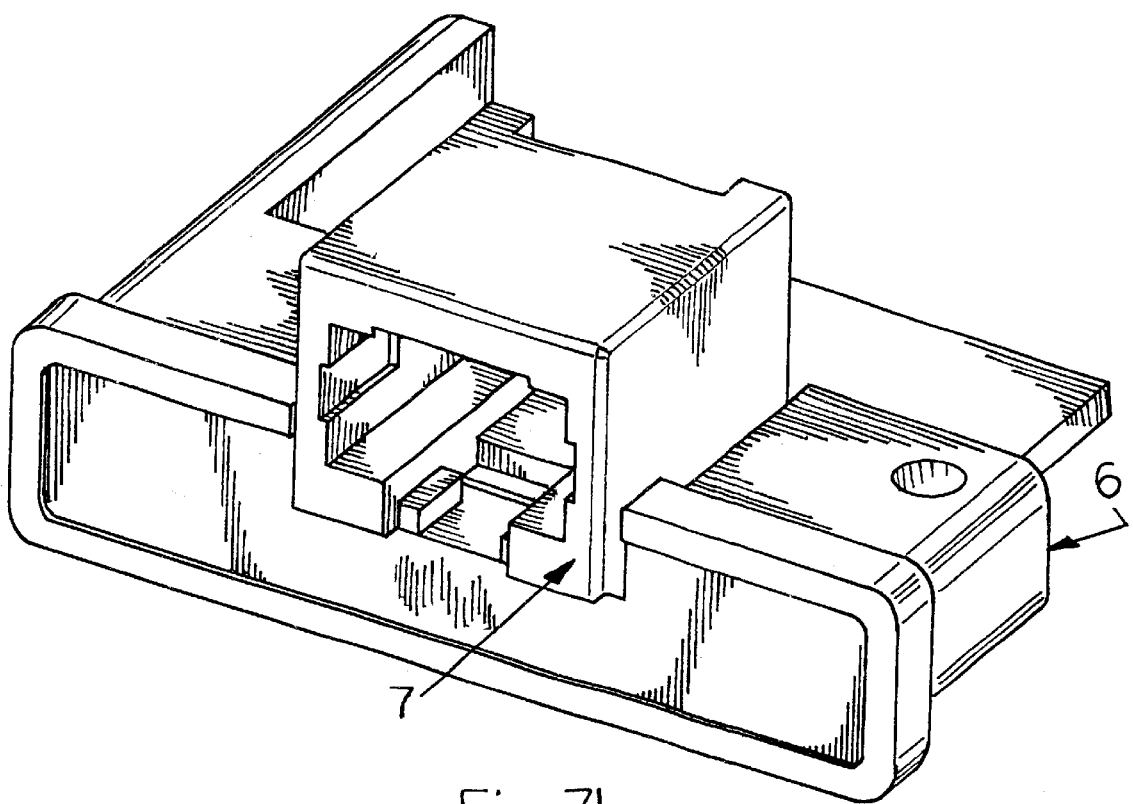
Figure 7C:
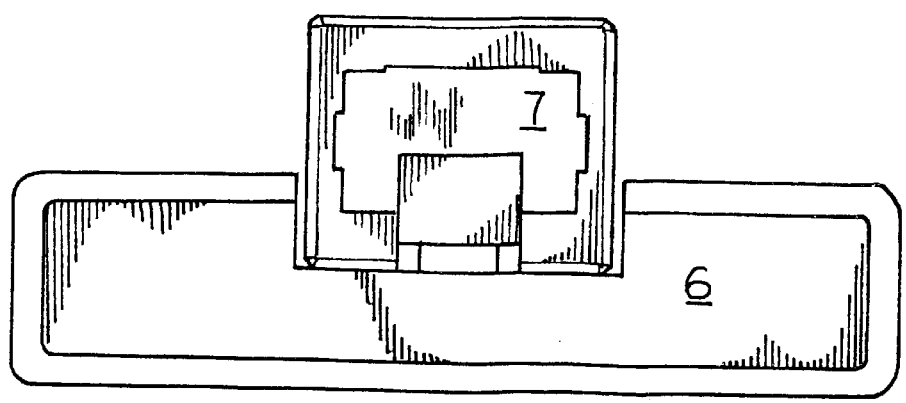

FIGS. 7A/7B are perspective views and FIG. 7C is a front plan view of the telecommunications wiring device jumper of the present invention as configured with a data jack.

Figure 8:
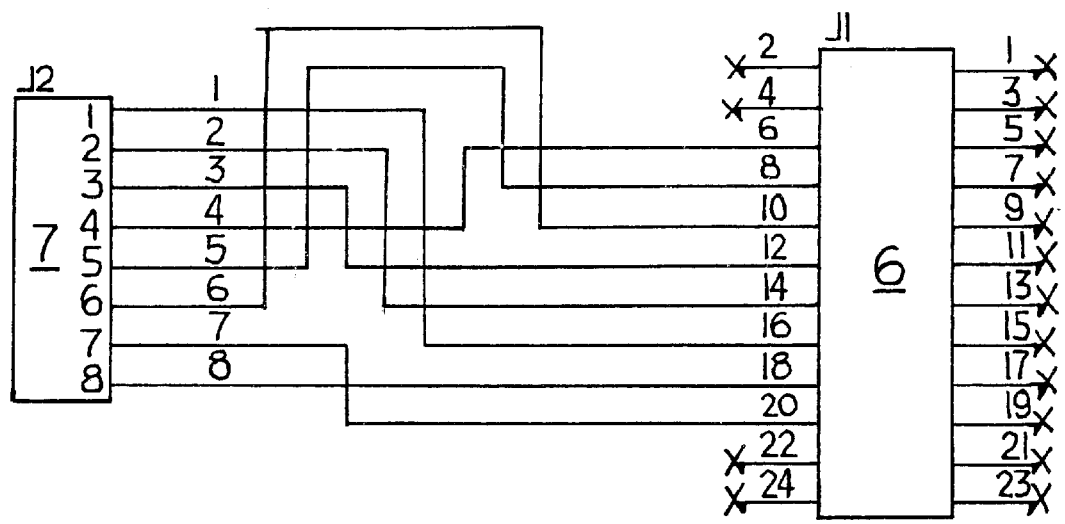

FIG. 8 is a schematic diagram of the telecommunications wiring device jumper of the present invention as configured with a data jack.

Figure 9A:
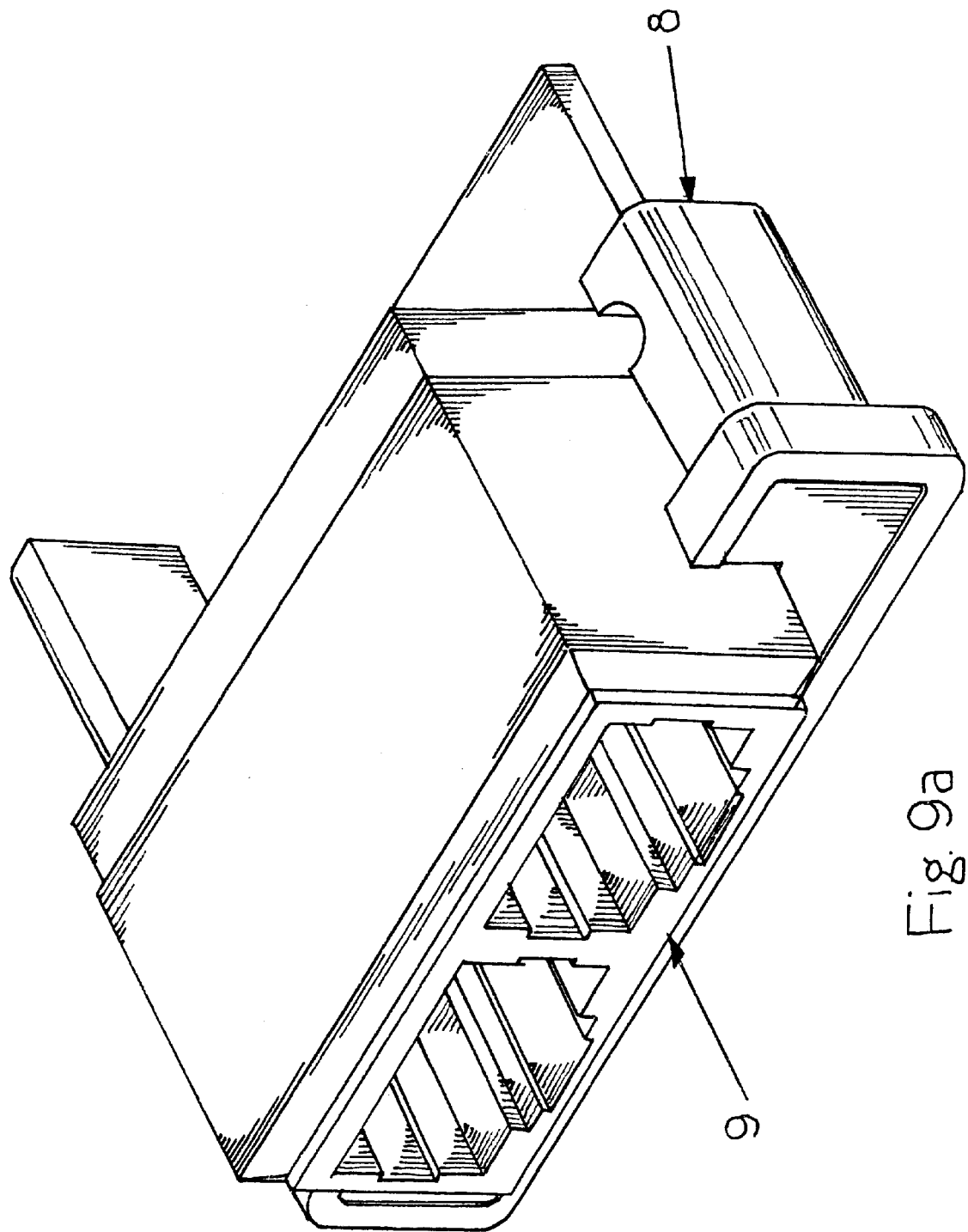
Figure 9B:
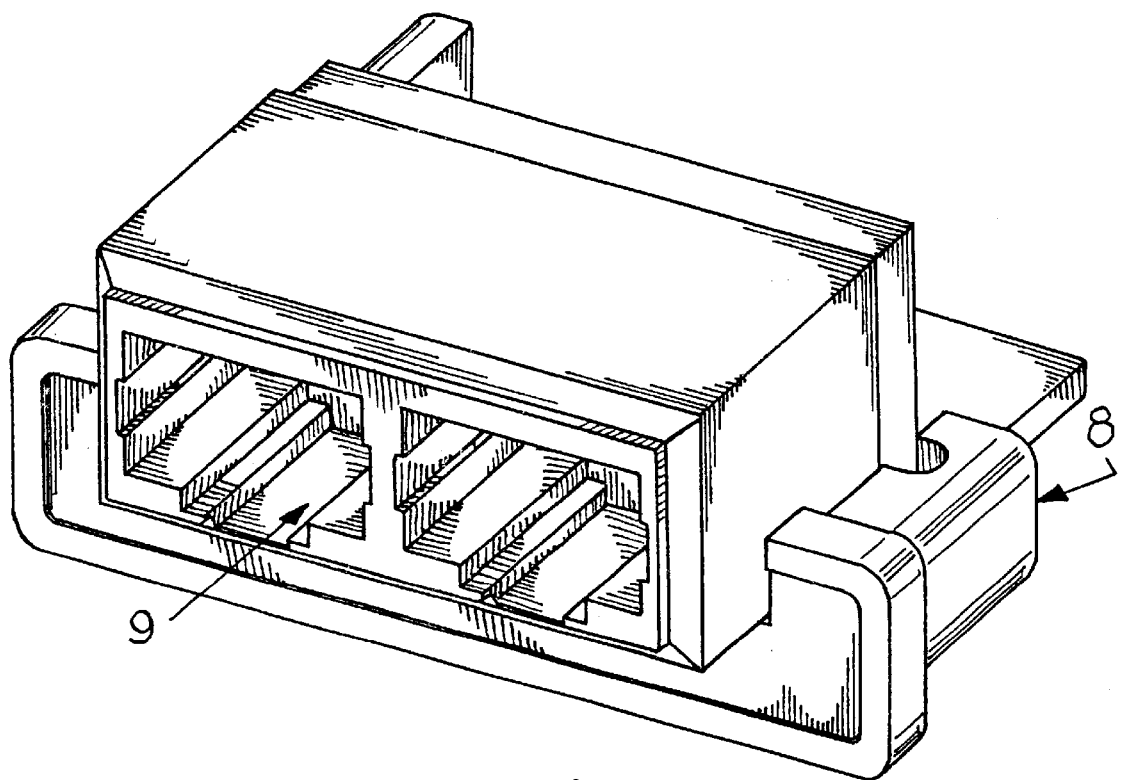
Figure 9C:
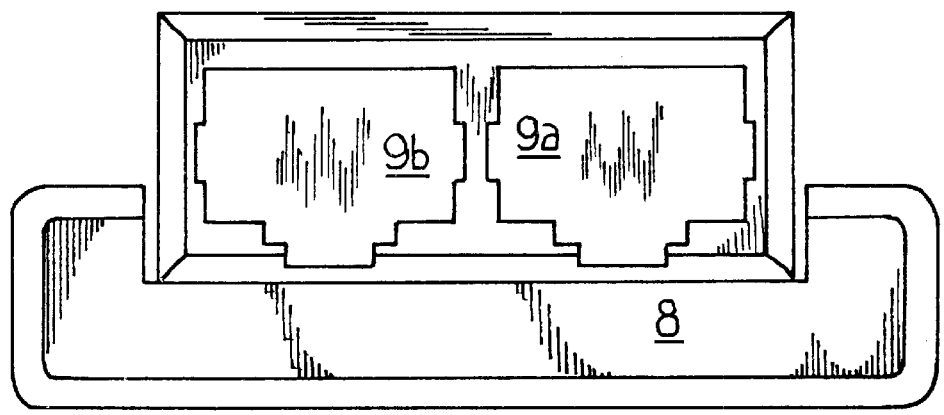

FIGS. 9A/9B are perspective views and FIG. 9C is a front plan view of the telecommunications wiring device jumper of the present invention as configured with test isolation jacks.

Figure 10:
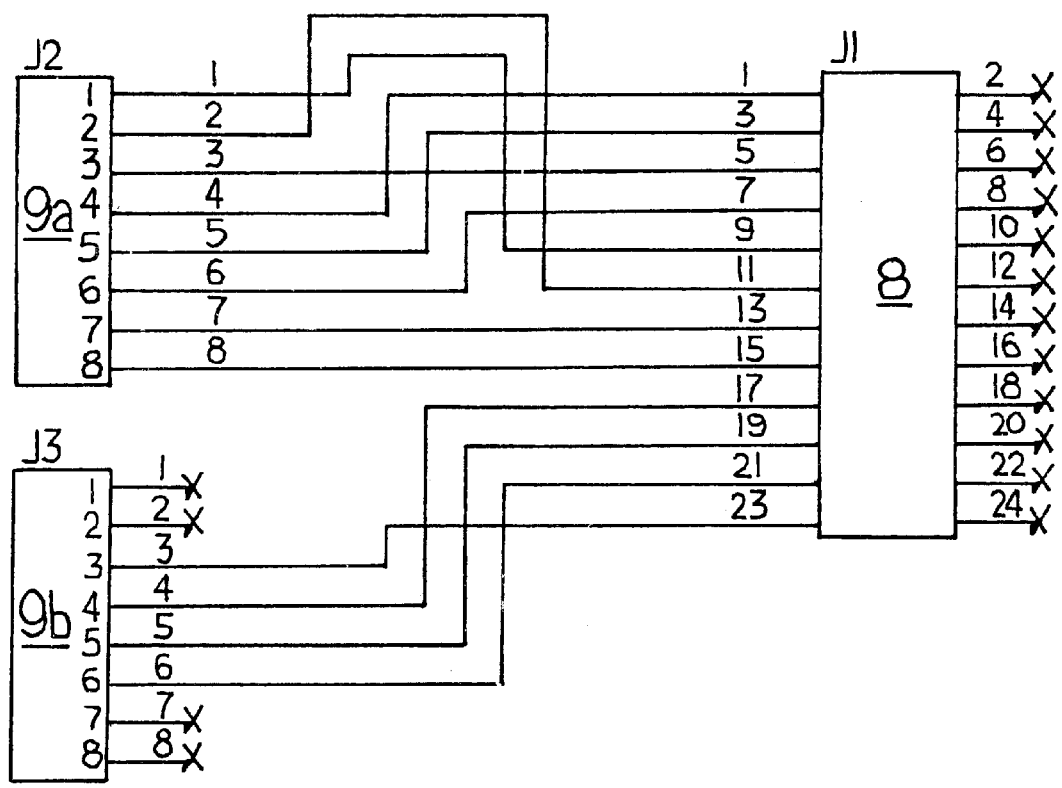

FIG. 10 is a schematic diagram of the telecommunications wiring device jumper of the present invention as configured with test isolation jacks.

DETAILED DESCRIPTION OF THE PRESENTLY PREFERRED EMBODIMENTS

Figure 1A:
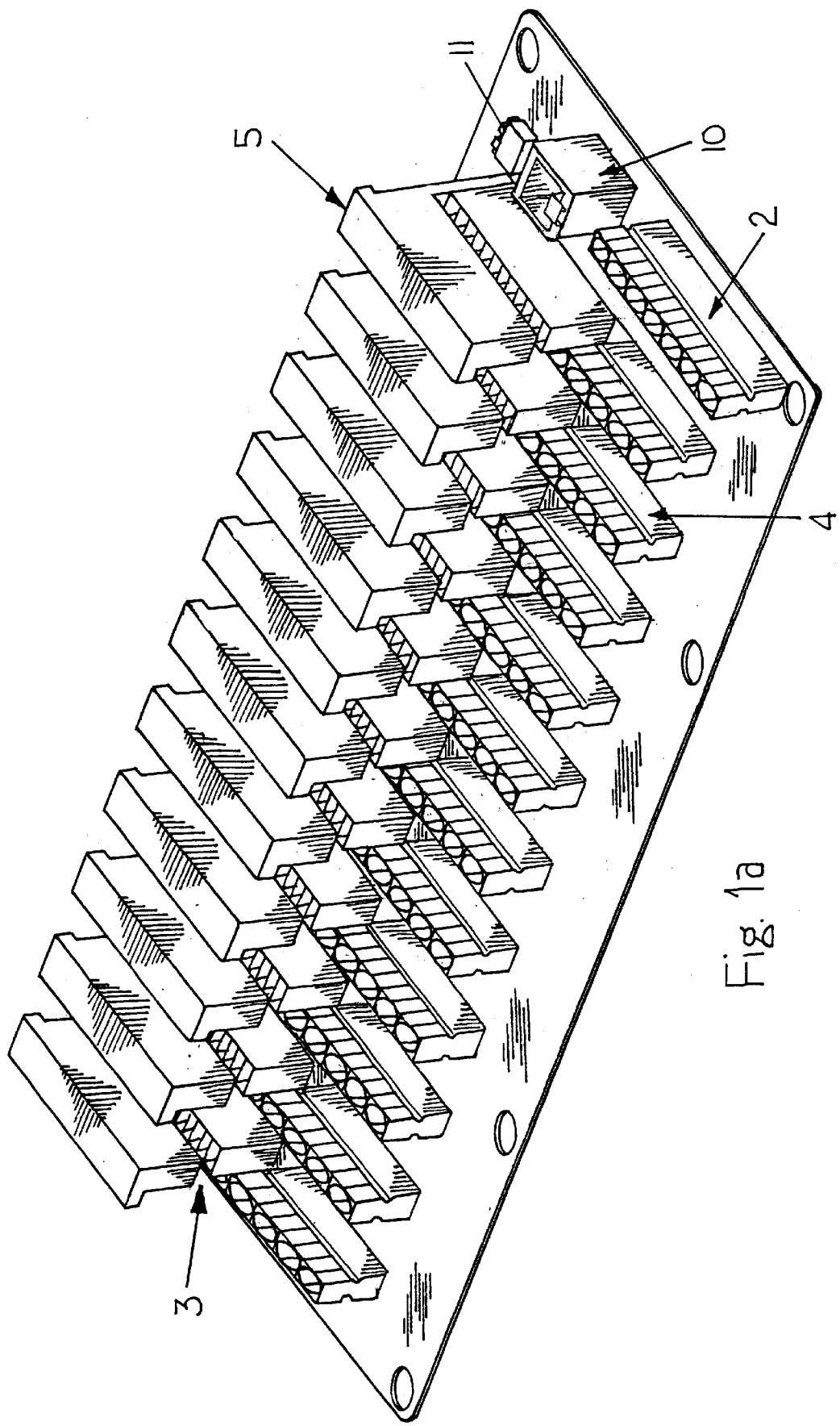
Figure 1B:
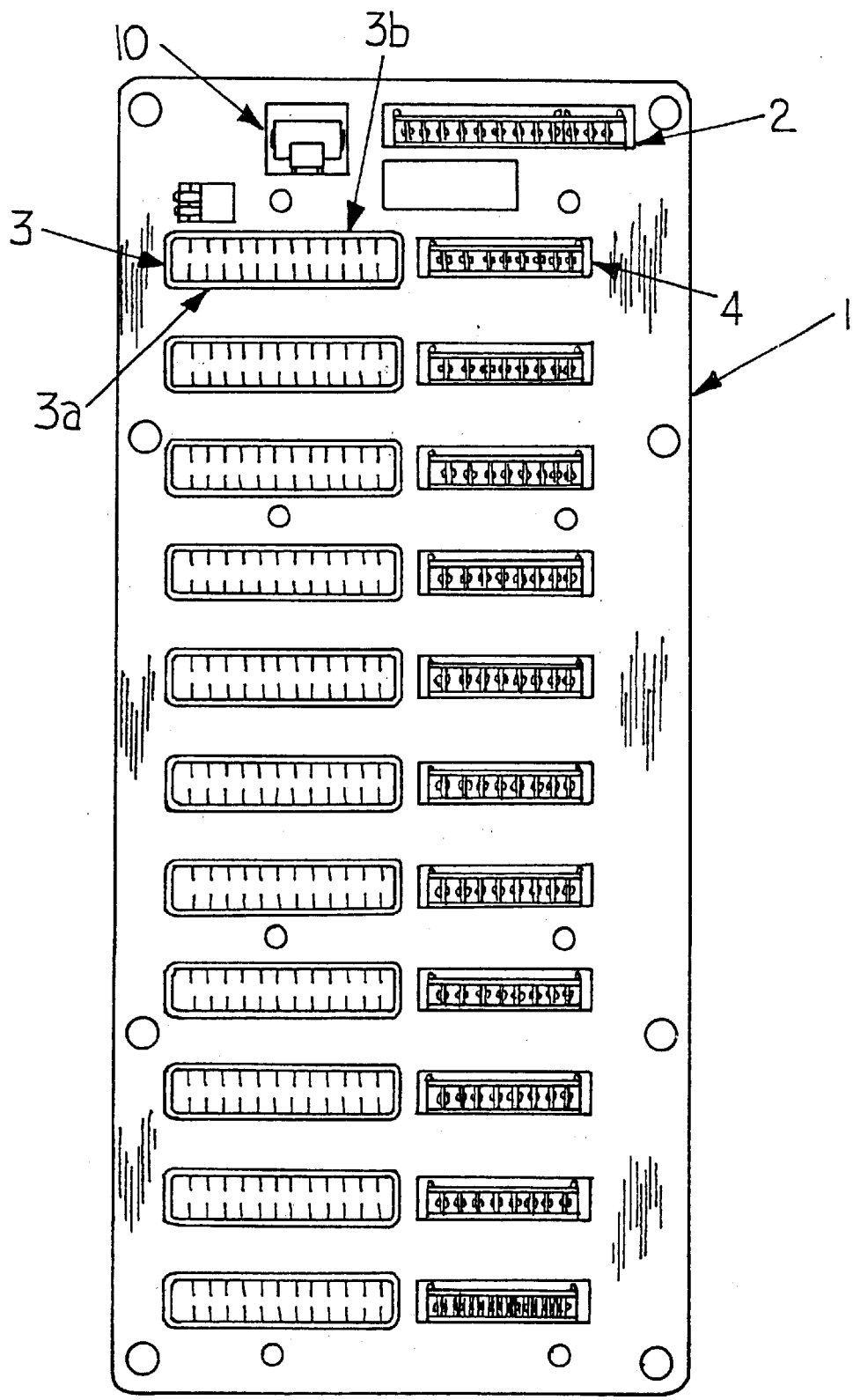
Figure 2A:
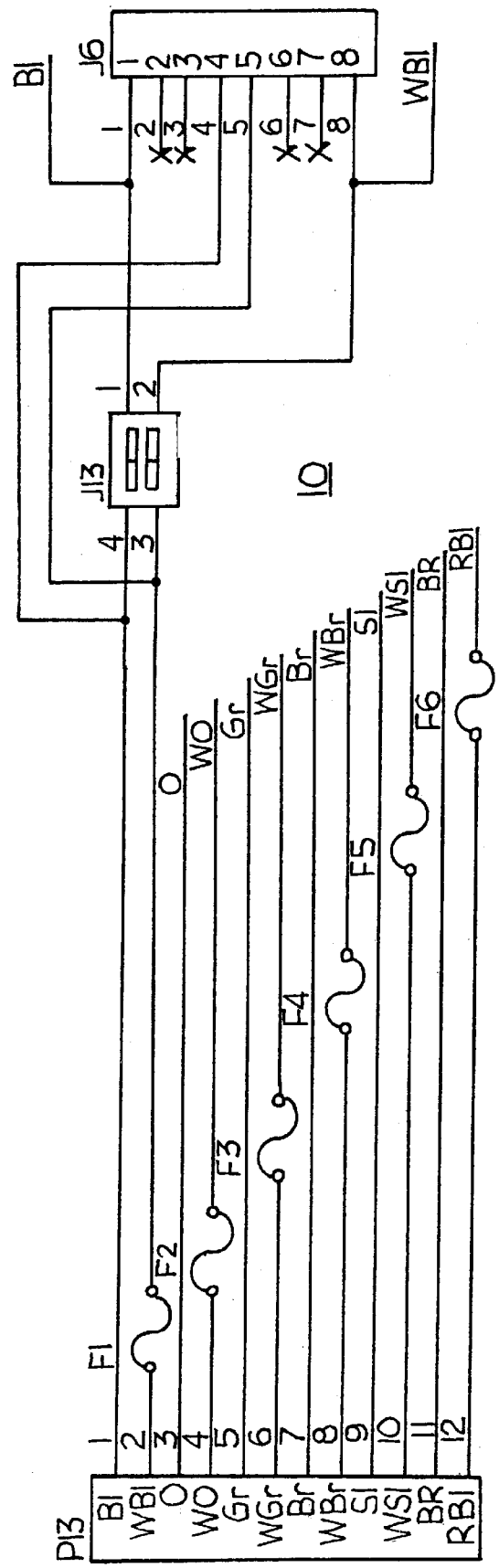
Figure 2B:
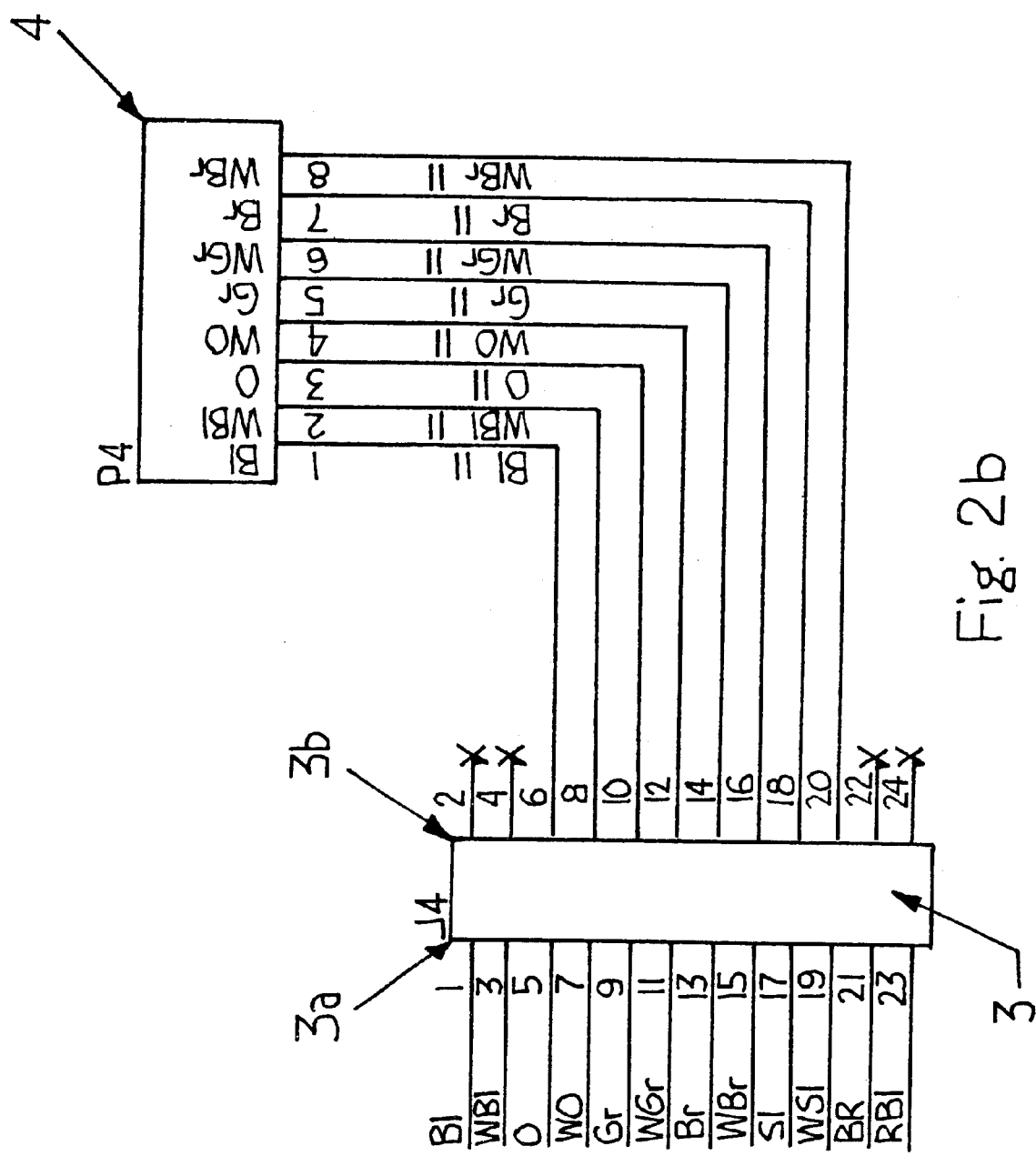
Figure 2C:
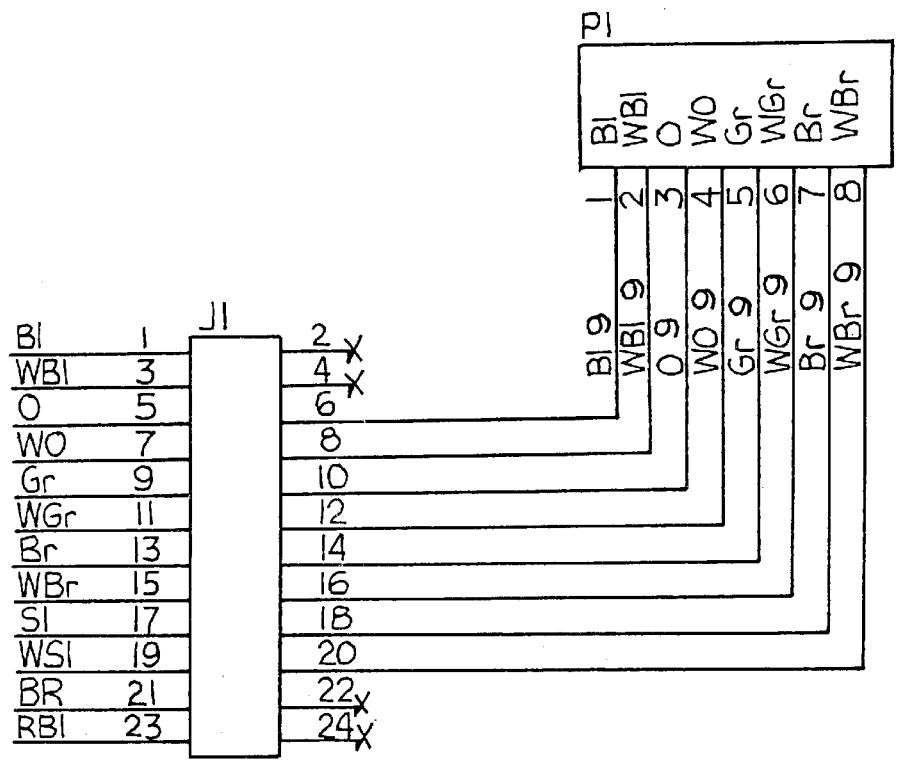
Figure 2D:
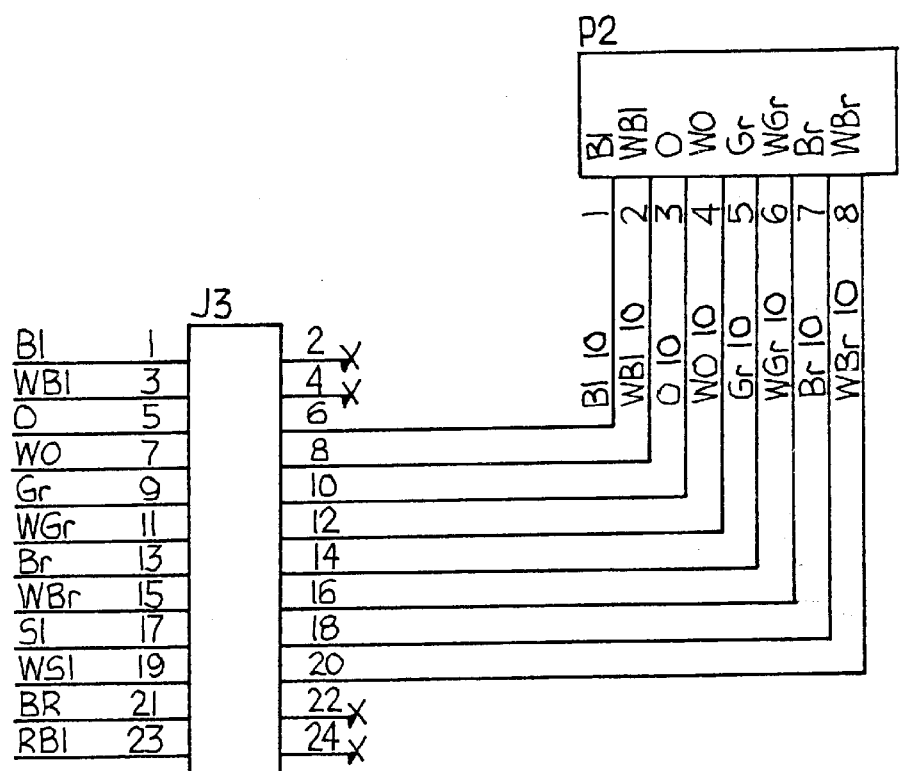
Figure 2E:
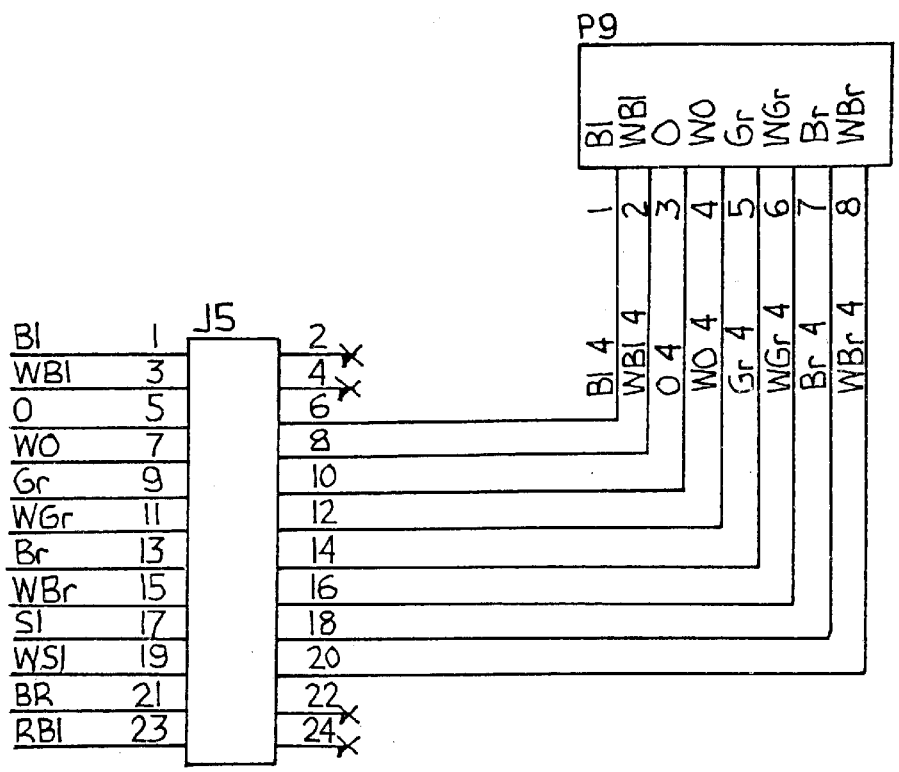
Figure 2F:
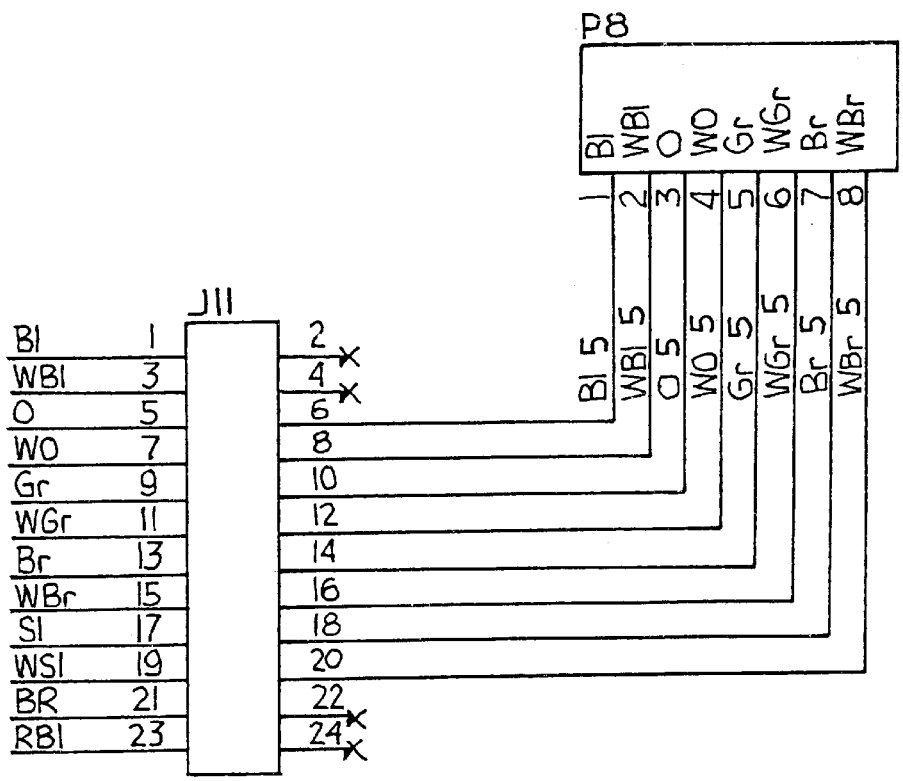
Figure 2G:
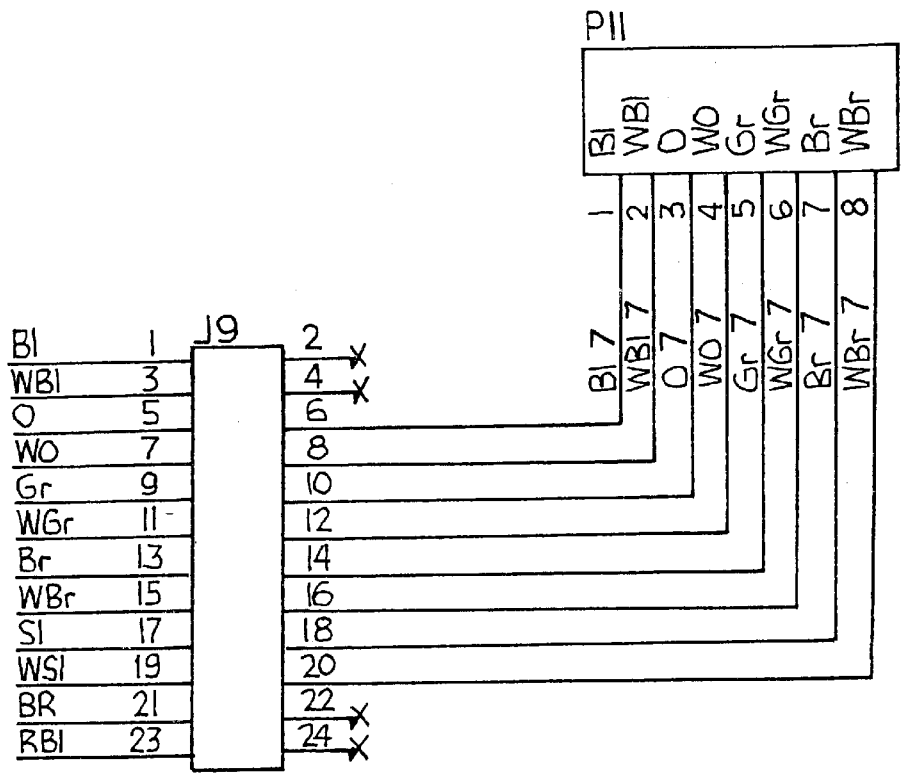
Figure 2H:
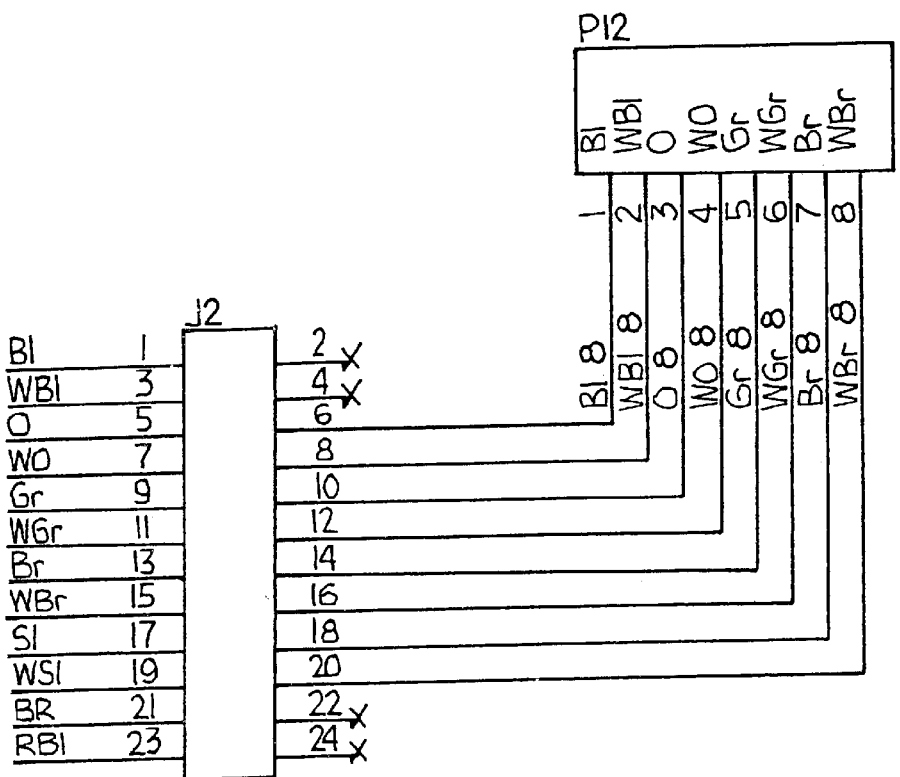
Figure 2I:
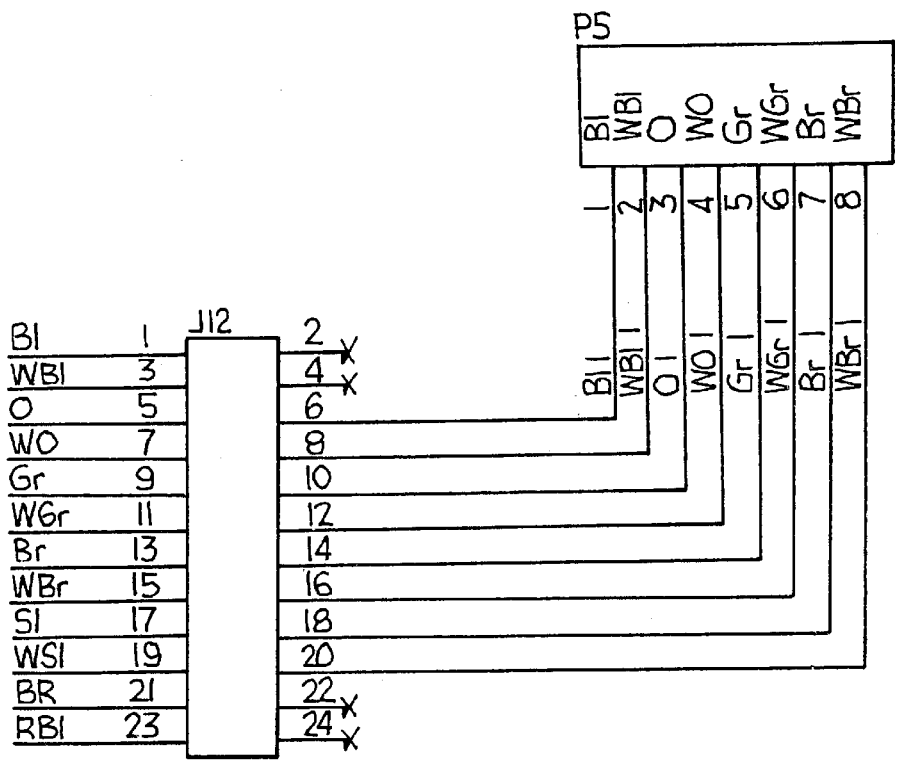
Figure 2J:
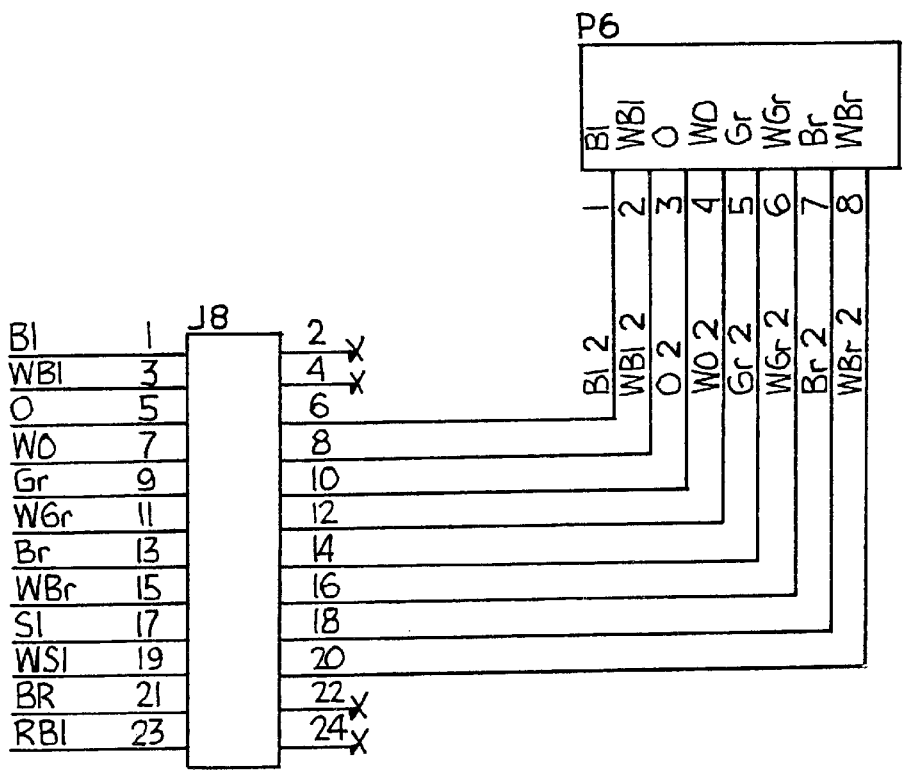
Figure 2K:
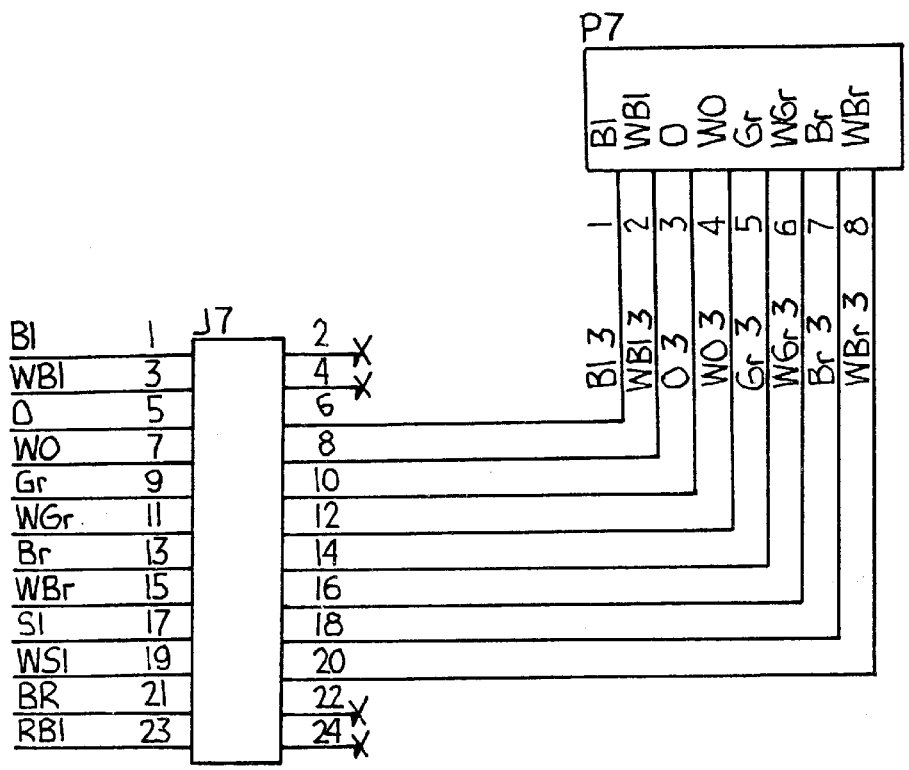
Figure 2L:
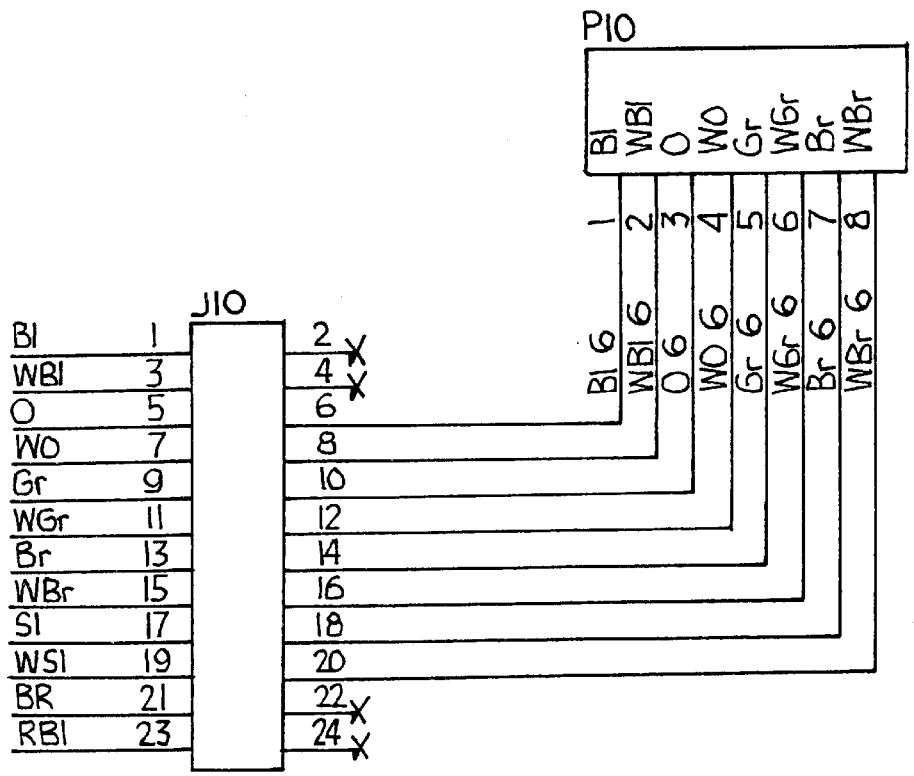
Figure 3A:
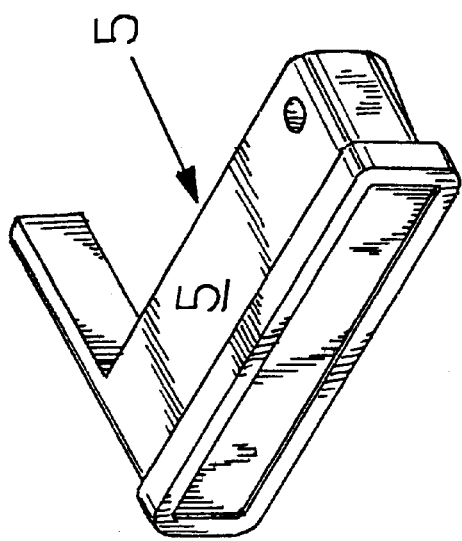
FIGS. 3A, 3B, 3C and 3D are perspective, top plan, front plan and side plan views, respectively, of a preferred embodiment of the telecommunications wiring device jumper of the present invention.
Figure 3D:
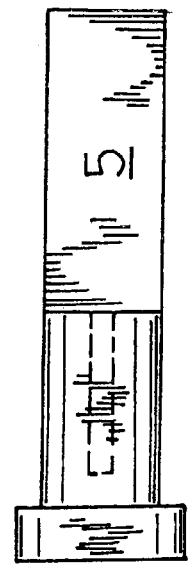
Figure 3B:
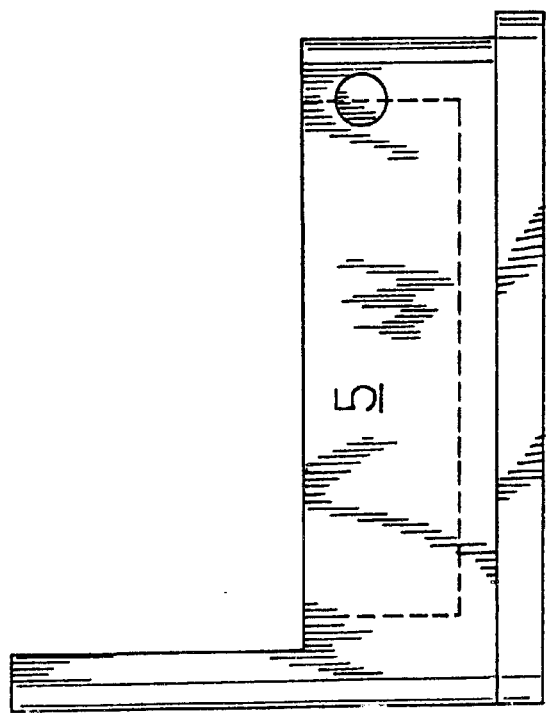
Figure 3C:
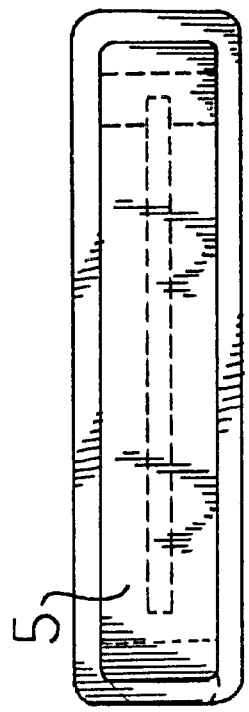
Figure 4A:
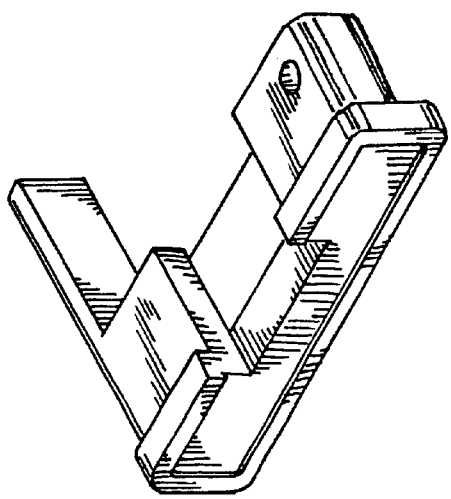
Figure 4D:
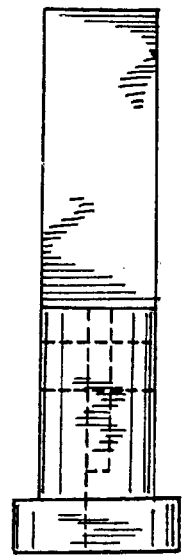
Figure 4B:
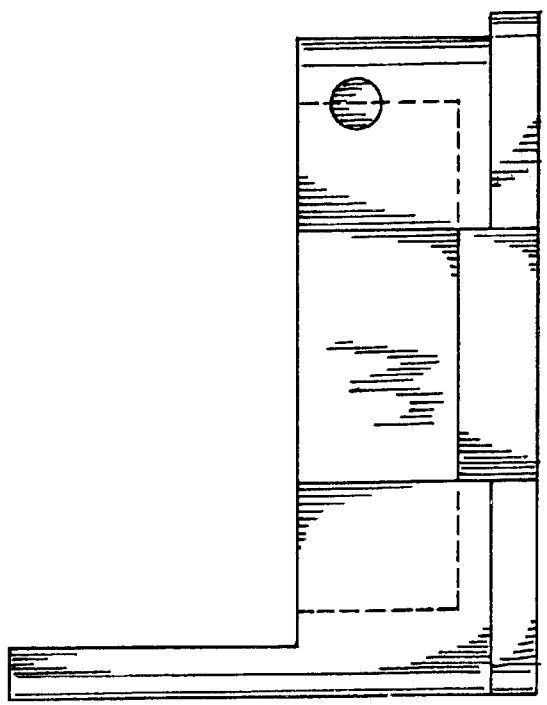
Figure 4C:
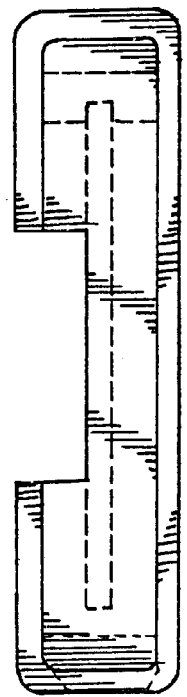
Figure 5A:
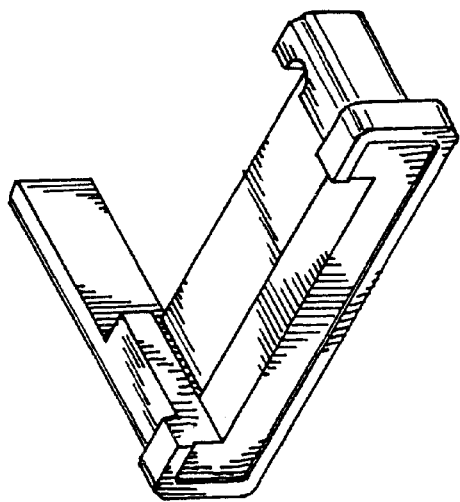
Figure 5D:
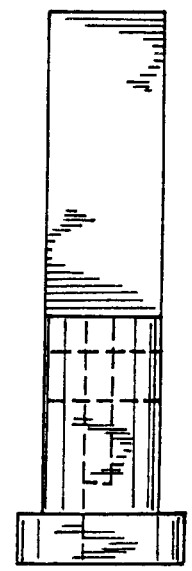
Figure 5B:
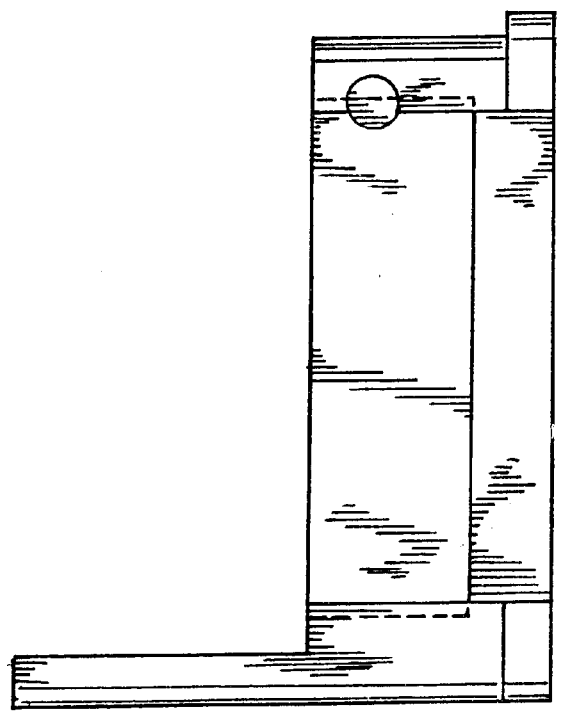
Figure 5C:
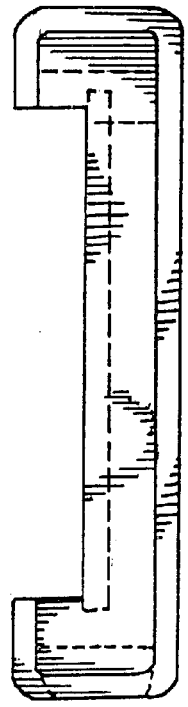
Figure 6A:
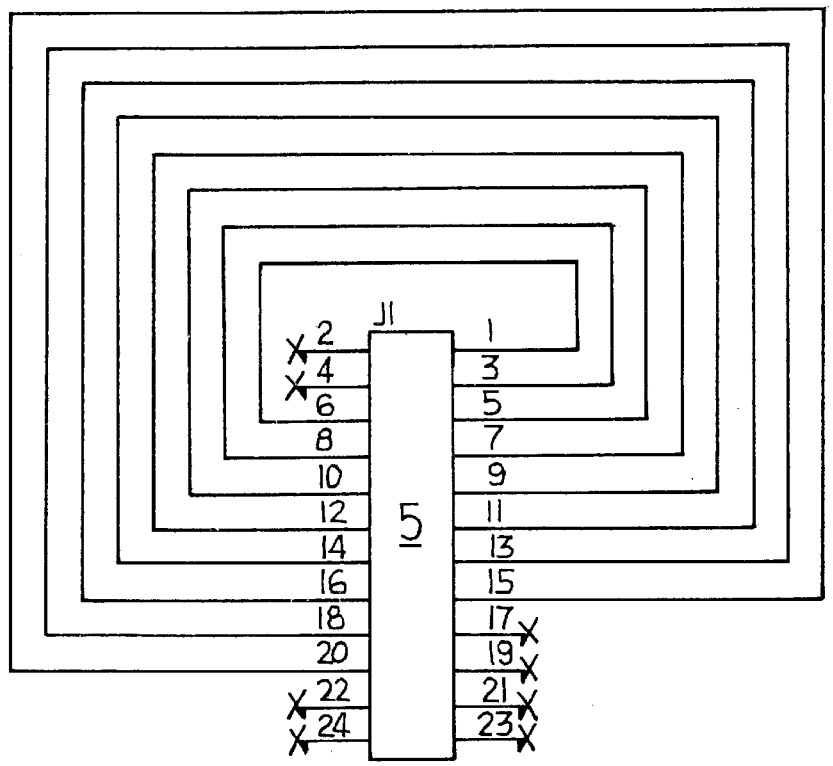
FIGS. 6A through 6F are schematic diagrams of various example wiring configurations that can be used with the telecommunications wiring device jumper of the present invention.
Figure 6B:
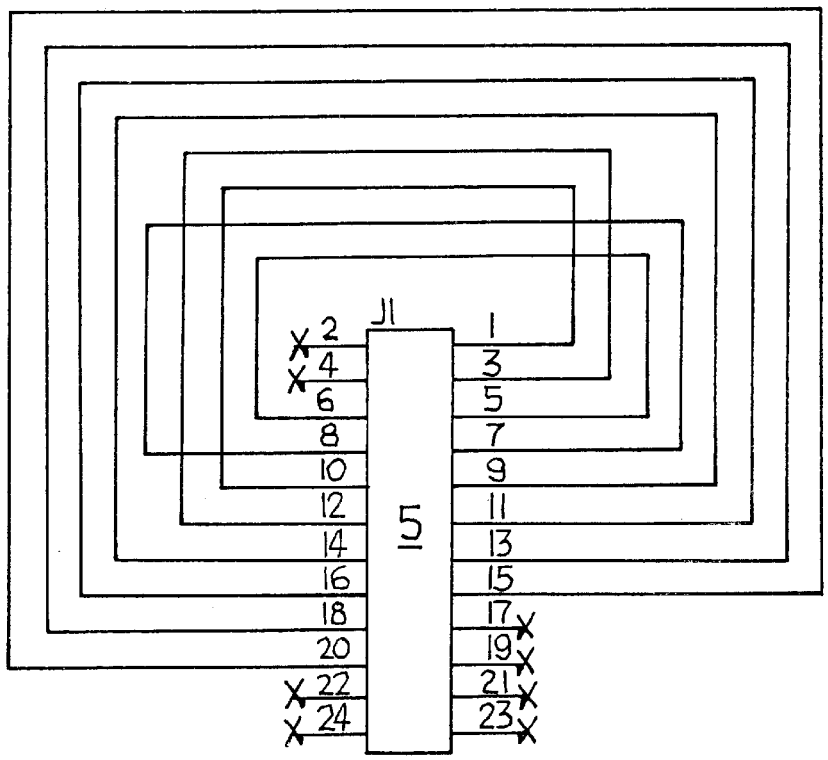
Figure 6C:
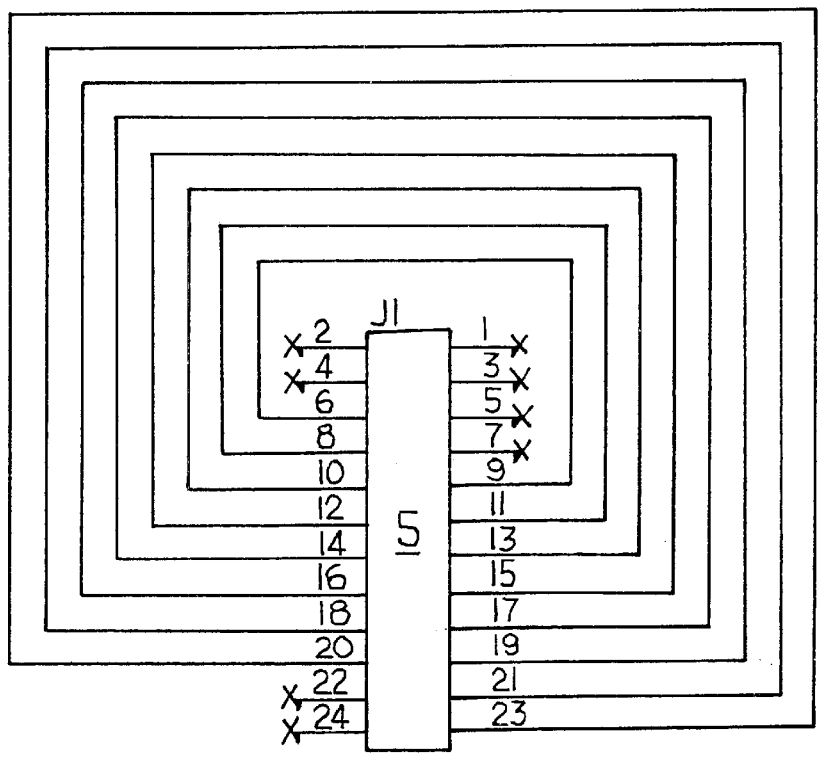
Figure 6D:
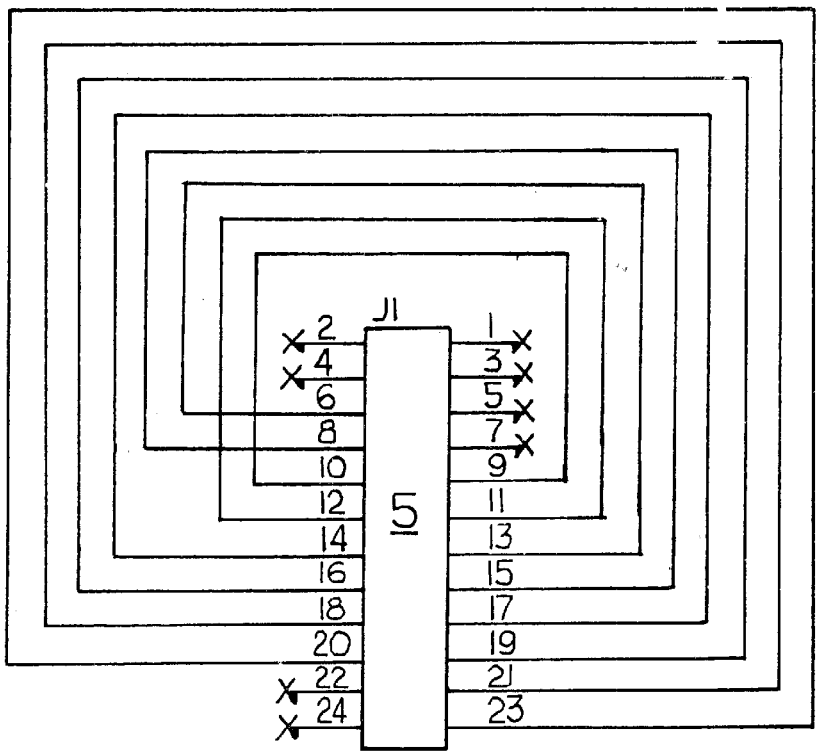
Figure 6E:
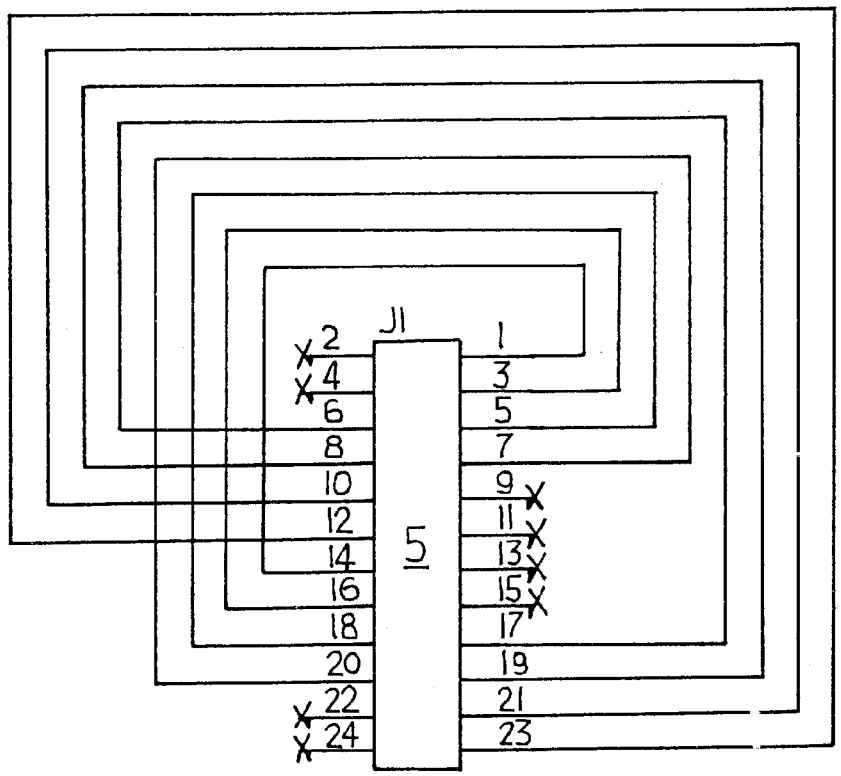
Figure 6F:
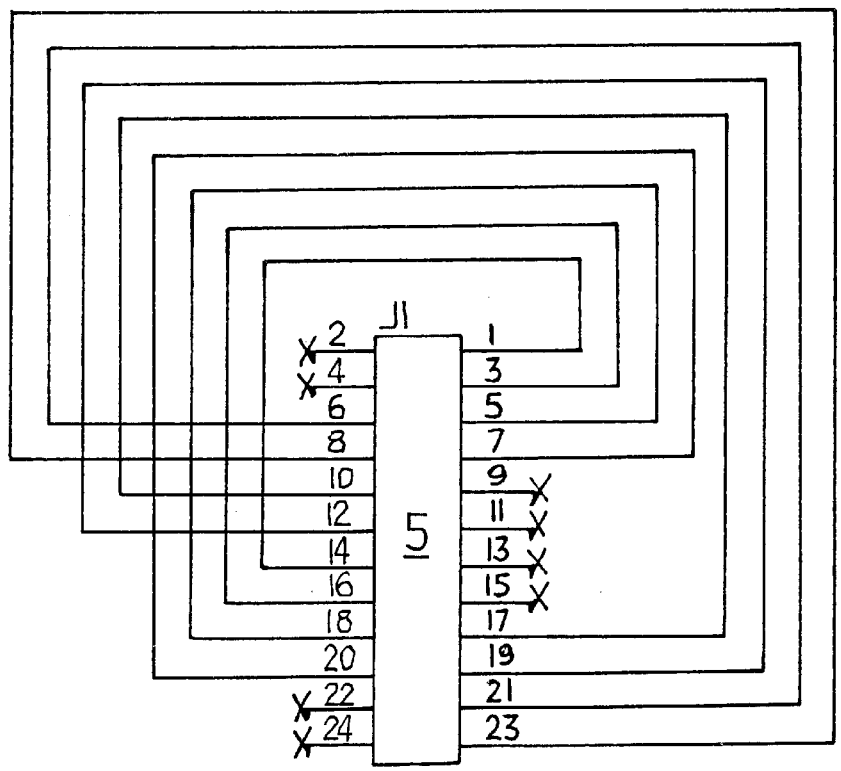

FIGS. 1A and 1B show an illustration of the telecommunications wiring device of the present invention, while FIG. 2 provides a schematic diagram of the device. The incoming wiring pairs for any number of telephone or data lines are connected to a circuit board 1 using a punch down type connector 2 or any other wire-terminating device, shown as a six (6) line/twelve (12) wiring pair connector in FIGS. 1 and 2. These incoming wires are routed on the circuit board 1 to the contacts on one side 3A or 3B (shown as side 3A in FIGS. 1 and 2) of any number of twenty-four (24) pin edge card connectors 3, with each side 3A and 3B shown in FIGS. 1 and 2 as having twelve (12) pin connectors to provide a pair of connectors (one incoming and one outgoing) for each wire in the twelve (12) wiring pair. The contacts on the opposite side (shown as side 3B in FIGS. 1 and 2) of the edge card connectors are routed on the circuit board to a wire terminating device or punch down block 4 connected to the individual telephone jack. Wires from the various locations where telecommunications devices are located in a home or office are connected to these termination blocks. All incoming and outgoing connections to these termination blocks are made identically following a color coded standard such as the TI 570A or 570B Standards. FIGS. 1 and 2 also show a security line seizure port 10 and an enabling dip switch 11 for the security line seizure block.

Routing of incoming telephone or data lines to a given location is accomplished by plugging a jumper 5 containing a unique wiring configuration into the edge card connector. These jumpers 5 connect the contacts on one side of the edge card connector 3A to the contacts on the opposite side of that connector 3B such that the unique wiring pattern on the jumper 5 accomplishes connection of the desired incoming telephone line (and thus telephone number) (connected at 3A in FIGS. 1 and 2) with the location assigned to that telephone number (connected at 3B in FIGS. 1 and 2). FIGS. 3A, 3B, 3C and 3D show an illustration of a preferred embodiment of the telecommunications wiring device jumper of the present invention, while FIGS. 4A–5A, 4B–5B, 4C–5C and 4D–5D illustrate alternate preferred embodiments of the telecommunications wiring device jumper of the present invention as configured for installation of a data jack and test isolation jack, respectively.

FIGS. 6A through 6F are schematic diagrams of various example wiring configurations that can be used with the telecommunications wiring device jumper 5 of the present invention. The jumper wiring pattern can be designed to route any combination of incoming telephone or data lines to any location in the home or office. Any given incoming telephone or data line can be re-routed to a different location within that home or office by simply unplugging the jumper providing the connection to the previously used location and replacing it with a differently configured jumper having the correct wiring pattern to provide the connection to the new location.

Another unique feature of the invention allows direct connection from an outside data source such as an Ethernet Hub or Switch directly to any given telephone outlet in the home or office. This is accomplished by using a data jumper card 6 having contacts on one side of the edge card connectors (i.e., the side 3B routed to the telephone outlets in the home or office as shown in FIGS. 1 and 2) that are connected to a RJ-45 telephone jack 7 on the data jumper card. The contacts on the opposite side of the edge card connector 3A remain unconnected. Using a cable from this data jack 7 to a data device, such as an Ethernet Hub, facilitates the networking of computers or other telecommunications devices connected to telephone outlets throughout the home or office. FIGS. 7A through 7C illustrate the telecommunications wiring device jumper of the present invention as configured with a data jack while FIG. 8 is a schematic diagram of the telecommunications wiring device jumper as configured with a data jack.

Another significant feature that the invention provides is for convenient isolation of the internal telecommunication network from the service provider network. When no jumper cards 5 or 6 are plugged into the edge card connectors 3, there is a physical break between the internal network and the service provider network. By utilizing a circuit board (or isolating test card) 8 that connects the contacts on one side of the edge card connector to standard telephone test jacks, the systems can be easily and conveniently checked. FIGS. 9A through 9C illustrate the telecommunications wiring device jumper of the present invention as configured with test isolation jacks while FIG. 10 is a schematic diagram of the telecommunications wiring device jumper as configured with test isolation jacks. Plugging this test isolation tool 8 into the edge card connector 3 so that it is connected to the contacts (shown as 3A in FIGS. 1 and 2) that are routed to the service provider allows testing for dial tone, correct line assignment, and tip and ring wiring correctness. A standard, readily available telephone test tool can be connected to this isolation test card 8 through test isolation jacks 9a and/or 9b or this test isolation tool could be produced to incorporate the testing function directly on the isolation test card 8. In the same manner, wiring integrity from the edge card connector to the telephone jack in the home or office could also be tested for continuity, correct line connection and crossed wires by plugging this test isolation tool 8 into the edge card connector 3 so that it is connected to the contacts (shown as 3B in FIGS. 1 and 2) that are routed to the telephone jack in the home or office.

While presently preferred embodiments of practicing the invention has been shown and described with particularity in connection with the accompanying drawings, the invention may otherwise be embodied within the scope of the following claims.

What is claimed is:

1. A telecommunications wiring device comprising any number of wire terminating devices connected to incoming and outgoing telecommunications signal transmission lines by jumpers configured to prevent rewiring when changing transmission lines at a given location, wherein:

(a) said incoming telecommunications lines are connected to a circuit board using said wire terminating devices;

(b) said incoming wire terminating device connections are routed to contacts on one side of any number of card connectors attached to said circuit board;

(c) contacts on the opposite side of said card connectors are routed to wire terminating devices connected to telecommunications outlets for connection to telecommunications devices; and (d) routing of an incoming telecommunications line to a telecommunications device is accomplished by installing a jumper containing a unique wiring pattern into a card connector such that said jumper connects the contacts on one side of said card connector to the contacts on the opposite side of that connector such that said unique wiring pattern accomplishes connection of an incoming telecommunications line with the location containing the telecommunications device assigned to that telecommunications line.

2. The telecommunications wiring device of claim 1, wherein said jumper wiring pattern routes any combination of incoming telecommunications lines to any locations containing telecommunications devices to be connected to said telecommunications lines.

3. The telecommunications wiring device of claim 1, wherein an incoming telecommunications line is re-routed to a different location by replacing the jumper connecting said telecommunications line to its previous location with a differently configured jumper having the correct wiring pattern to provide the connection to the new location.

4. The telecommunications wiring device of claim 1, wherein direct connection from an outside data source to any telecommunications device outlet is made by a data jumper having contacts on the side of said card connector routed to the telecommunications device outlet that are connected to a telecommunications jack on the data jumper and wherein the contacts on the opposite side of the card connector remain unconnected such that a connection from said telecommunications jack to said outside data source establishes a network with another data device or other telecommunications device connected to said telecommunications device outlet.

5. The telecommunications wiring device of claim 4 wherein said outside data source comprises an Ethernet Hub or Switch.

6. The telecommunications wiring device of claim 4 wherein said telecommunications jack comprises an RJ-45 telephone jack.

7. The telecommunications wiring device of claim 1 wherein a telecommunications device outlet is isolated from the incoming telecommunications line serving said outlet by removing the jumper from the card connector connecting said outlet with said incoming line.

8. The telecommunications wiring device of claim 7 wherein said incoming telecommunications line or said telecommunications device outlet is tested using a test card connecting the contacts on the side of the card connector attached to said incoming telecommunications line or said telecommunications device outlet to a test jack.

9. The telecommunications wiring device of claim 8 wherein said incoming telecommunications line is tested by attaching said test card to the card connector attached to said incoming telecommunications line.

10. The telecommunications wiring device of claim 8 wherein said telecommunications device outlet is tested by attaching said test card to the card connector attached to said telecommunications device outlet.

11. The telecommunications wiring device of claim 8 wherein testing is accomplished by a telephone test tool connected to said test card.

12. The telecommunications wiring device of claim 8 wherein testing is accomplished by incorporating the testing function within said test card.

13. The telecommunications wiring device of claim 9 wherein testing for dial tone, correct line assignment, tip or ring wiring correctness of said incoming telecommunications line is accomplished.

14. The telecommunications wiring device of claim 10 wherein testing for wiring integrity, continuity, correct line connection or crossed wires from said card connector to said telecommunications device outlet is accomplished.

15. The telecommunications wiring device of claim 1, wherein said telecommunications lines comprise telephone lines.

16. The telecommunications wiring device of claim 1, wherein said telecommunications lines comprise data lines.

17. The telecommunications wiring device of claim 1, wherein said telecommunications lines comprise telephone and data lines.

* * * * *